United States Patent
De Crecy

(10) Patent No.: US 8,195,420 B2
(45) Date of Patent: Jun. 5, 2012

(54) DEVICE FOR MEASURING ALIGNMENT OF ADJOINING STRUCTURES

(75) Inventor: Francois De Crecy, Seyssins (FR)

(73) Assignee: Comissariat a l'Energie, Paris (FR)

( * ) Notice: Subject to any disclaimer, the term of this patent is extended or adjusted under 35 U.S.C. 154(b) by 365 days.

(21) Appl. No.: 12/545,383

(22) Filed: Aug. 21, 2009

(65) Prior Publication Data

US 2010/0049467 A1 Feb. 25, 2010

(30) Foreign Application Priority Data

Aug. 22, 2008 (FR) ..................... 08 04677

(51) Int. Cl.
*G01B 21/00* (2006.01)
(52) U.S. Cl. ..................................... 702/136
(58) Field of Classification Search ............... 702/136
See application file for complete search history.

(56) References Cited

U.S. PATENT DOCUMENTS 4,035,607 A * 7/1977 Wu ............................... 347/205

FOREIGN PATENT DOCUMENTS

| KR | 20010035519 A | 7/2001 |
| WO | 02/069393 A | 9/2002 |

OTHER PUBLICATIONS

Steven E. Steen et al., Overlay as the Key to Drive Wafer Scale 3D Integration, Microelectric Engineering, May 6, 2007, pp. 1412-1415, vol. 84, Elsevier B.V., Amsterdam, Netherlands.
A. Petropoulos et al., A Novel System for Displacement Sensing, Integrated on a Plastic Substrate, Microelectronics Journal, Jun. 19, 2008, pp. 1-6, Elsevier Ltd., Internet Extract.
Mark A. Lantz et al., A Micromechanical Thermal Displacement Sensor with Nanometre Resolution, Nanotechnology, Aug. 1, 2005; pp. 1089-1094, vol. 16, Institute of Physics Publishing, Bristol, United Kingdom.

* cited by examiner

*Primary Examiner* — Tung S Lau
(74) *Attorney, Agent, or Firm* — LaRiviere, Grubman & Payne, LLP

(57) ABSTRACT

The invention relates to the field of micro- and nanotechnologies. In these techniques, it is sometimes necessary to glue several structures face to face and it is important to be able to check the alignment of the structures. A new method for measuring alignment, which comprises the following operations, is proposed for this purpose: activation of a heating element placed on the surface of the first structure, generation of electronic signals representative of a distribution of temperatures, on the basis of an array of temperature sensitive elements placed on the surface of the second structure, determination of a relative position of the heating element with respect to the array of sensitive elements, therefore of the first structure with respect to the second, on the basis of the distribution of temperatures, in a calculation circuit receiving the electronic signals engendered in the array of sensitive elements.

13 Claims, 3 Drawing Sheets

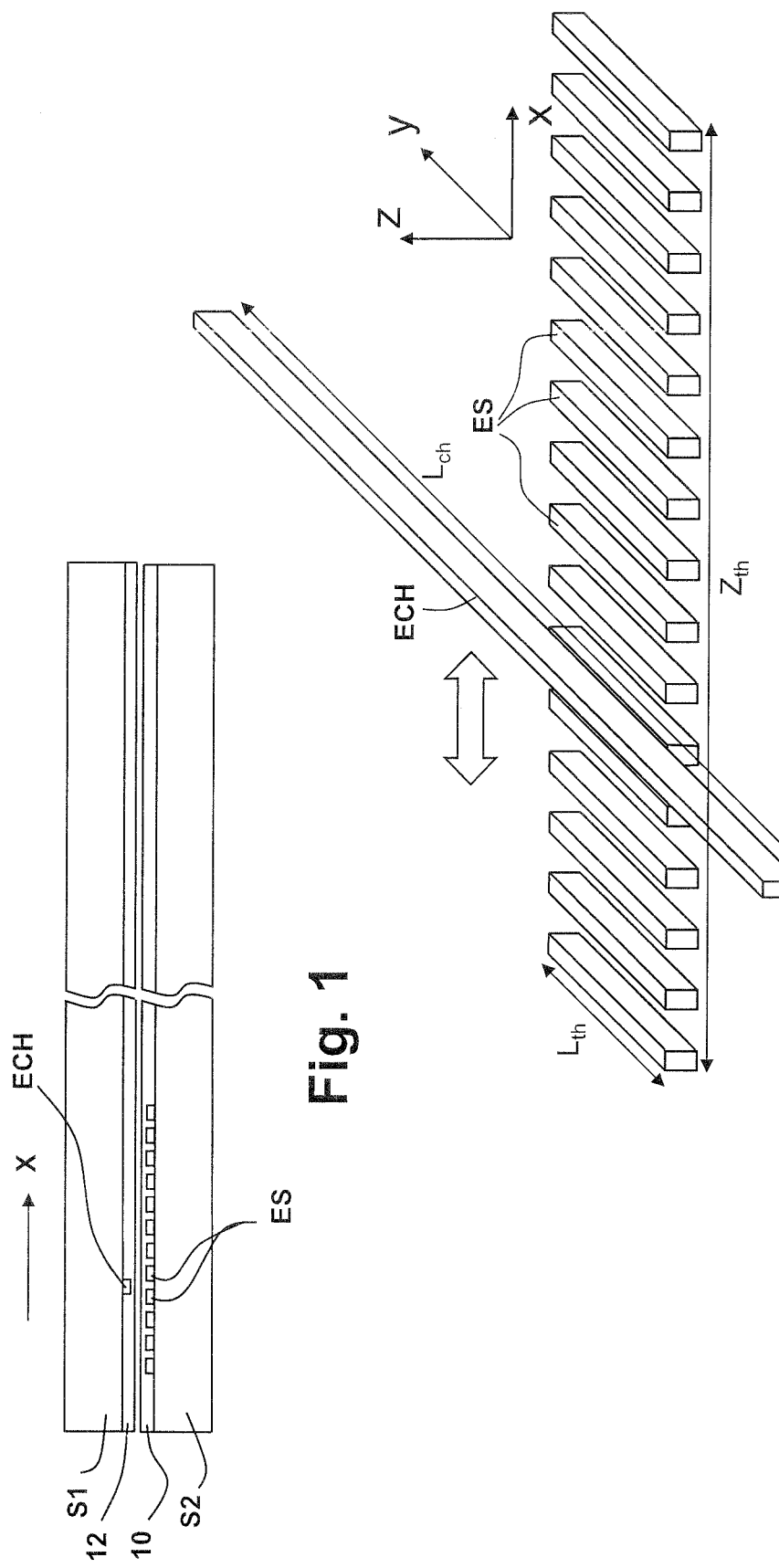

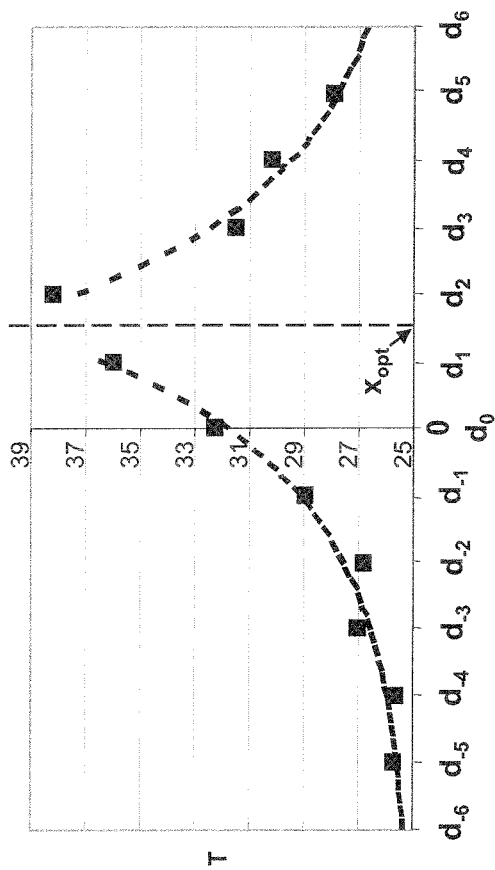
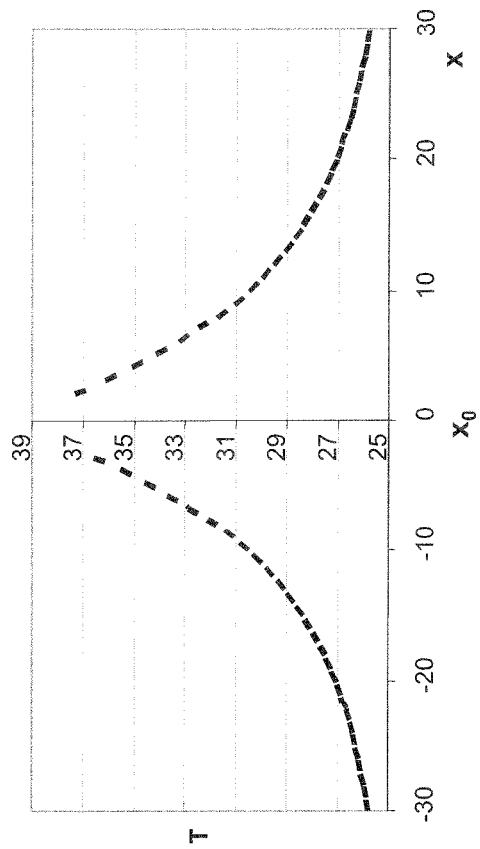
Fig. 4
Fig. 3

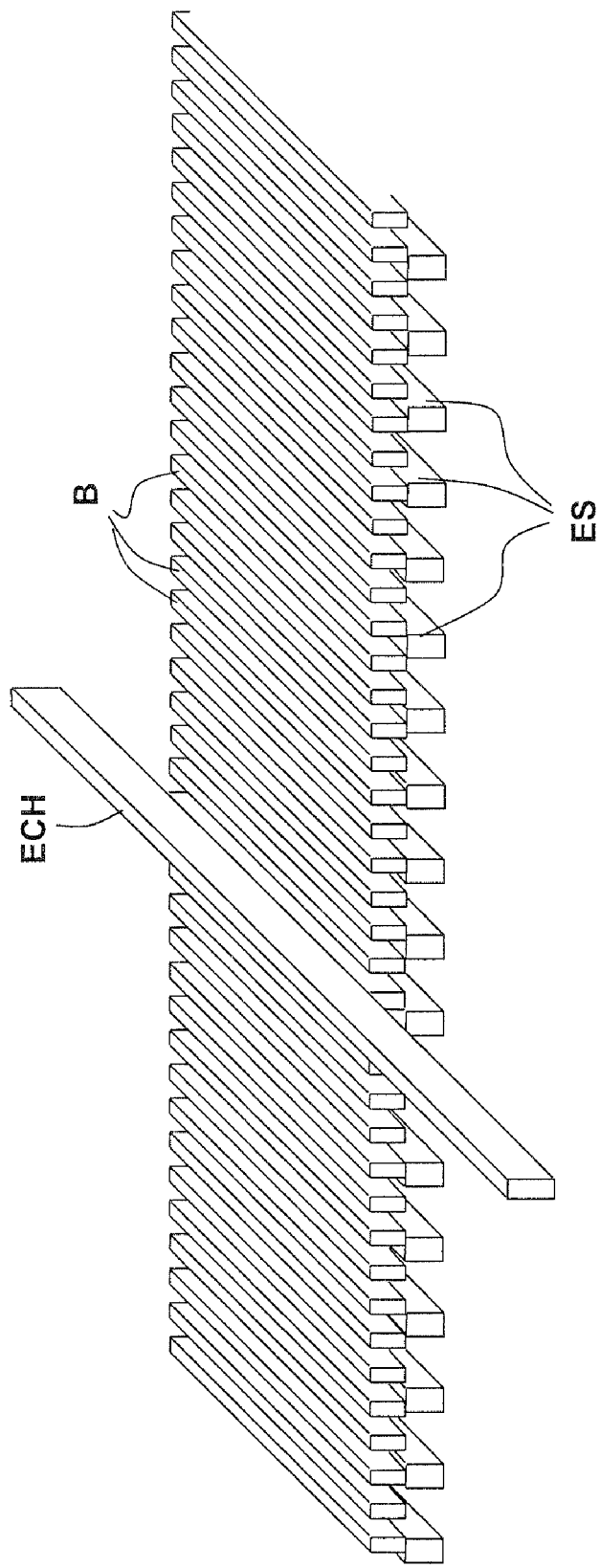

DEVICE FOR MEASURING ALIGNMENT OF ADJOINING STRUCTURES

PRIORITY CLAIM

This application claims priority to French Patent Application Number 08 04677, entitled Device for Measuring Alignment of Adjoining Structures, filed on Aug. 22, 2009.

FIELD OF INVENTION

The invention relates to the field of micro- and nanotechnologies, that is to say the field of structures micro-machined on microchips fabricated collectively on plane wafers which are thereafter sliced up into individual microchips at the end of the method of collective fabrication.

BACKGROUND OF INVENTION

Micro-machined structures use the techniques of deposition, etchings, ion implantations, etc. developed in the field of electronic integrated circuits and then extended to other fields. The scale of the micro-machined elements can drop below, or indeed even greatly below, a micrometer. These structures are either purely electronic (integrated electronic circuits) or mixed, involving for example optical elements (image sensors, displays, optical modulators for example) or mechanical elements (accelerometers, pressure sensors, for example), or even chemical (chemical sensors) or biological (bio-sensors) elements.

These structures are manufactured collectively on plane support wafers which are usually made of silicon when the structures comprise electronic elements.

During this fabrication, it may be required to execute steps of very precise alignment between two structures, for example with a view to a precise gluing of an individual microchip (already cut) onto a wafer, or else with a view to gluing two wafers together, with elements of the first wafer placed very precisely opposite elements of the second wafer. Such is typically the case when it is desired to interconnect several microchips by gluing them on a wafer which carries interconnection conductors. In this case, the contacts of the microchip must be precisely aligned with corresponding contact tags of the wafer.

In general, the alignment of the microchip on the wafer or the alignment of the first wafer on the second wafer is measured by optical procedures, often in the infrared (for which silicon is transparent) because it may be necessary to measure an alignment through the thickness of the microchip or wafer. Use is made of optical alignment marks formed on the two items to be glued. These measurements make it possible either to put the items in place during fabrication or to check by measurement the degree of possible misalignment after fabrication.

Sometimes, alignment is facilitated by hollowing out deep trenches in the silicon at the location of the alignment marks, so that the light rays which allow the alignment to be checked pass more easily through the thickness of the microchip or wafer.

For destructive measurements of misalignment, it is possible to use electron microscopes and observe the structures cut (and therefore destroyed).

Consideration has also been given to performing mechanical alignment by nesting male and female patterns machined or photolithographed on the items to be placed opposite one another, but this does not allow measurements of alignment quality to be made.

Thought has also been given to aligning items by magnetic means, namely magnetic micro-domains deposited on each of the items and which mutually attract one another while the items are being put in place so as to favour well defined alignment. Here again, no measurement is possible.

Optical measurement procedures remain the most effective but suffer from drawbacks, in particular that of the insufficient transparency of the substrate when the alignment requires seeing through a substrate. If the substrate is made of silicon, one is forced to use infrared radiation in order for the radiation to pass through it, and the precision of alignment can scarcely drop below half the wavelength of the radiation used. Even with infrared radiation it is still necessary for the silicon not to be overly doped, the doping reducing its transparency, and it is necessary to prevent there being any metallic interconnection layers in the vicinity of the alignment marks. These marks take up room. Moreover, the layer of glue interposed between the microchip and the wafer or between two wafers must itself be transparent to infrared.

SUMMARY OF THE INVENTION

To measure the quality of alignment of two adjoining plane structures fastened together, the invention proposes an original procedure. It consists in providing a heating element on the surface of one of the structures and an array of temperature sensitive elements on the surface of the second structure; the form, orientation and position of the heating element with respect to the first structure are known; the form, orientation and position of each individual sensitive element with respect to the second structure are also known; a measurement and calculation circuit linked to the sensitive elements evaluates the position of one structure with respect to the other as a function of the responses of each of the individual sensitive elements to the temperature variations engendered by the heating element when the two structures are applied one against the other, the heating element being opposite the array of sensitive elements. The responses of the sensitive elements make it possible in fact to establish a temperature distribution profile on the basis of which it is possible to search for a temperature maximum; the position of this maximum in the array of sensitive elements provides an indication regarding the position of the heating element with respect to the sensitive elements, and therefore regarding the position of the first structure with respect to the second structure.

The invention therefore proposes a device comprising two plane structures, adjoining face to face and fastened together, characterized in that the first structure comprises, on its face opposite the second structure, a heating element whose form, orientation and position are known, in that the second structure comprises, on its face opposite the first structure, an array of temperature sensitive elements whose form, orientation and position with respect to the second structure are also known, the device also comprising an electrical power supply means for the heating element of the first structure and a means for establishing electrical measurements representing the distribution of temperatures in the array of sensitive elements of the second structure, with a view to deducing from this distribution a measurement of relative alignment of the adjoining structures.

The method for measuring the quality of the alignment of two structures adjoining face to face is characterized by the following operations:

activation of a heating element placed at a known position on the surface of the first structure, generation of electronic signals representative of a distribution of temperatures, on the basis of an array of temperature sensitive elements placed at known positions on the surface of the second structure, determination of a relative position of the heating element with respect to the array of sensitive elements, on the basis of the distribution of temperatures, in a calculation circuit receiving the electronic signals engendered in the array of sensitive elements.

The relative position determination preferably comprises the search for a theoretical curve of temperature distribution which corresponds in an optimal manner to a temperature distribution obtained on the basis of the electronic signals representative of the temperature, and the calculation of the position, referenced with respect to the array of sensitive elements, of a peak of this curve. This position calculation will preferably be done in the following manner: calculation of several theoretical curves as a function of a parameter $x_0$ which is a possible position of the heating element with respect to the array of sensitive elements, determination for each theoretical curve of a sum, optionally weighted, of squares of deviations between the values of the theoretical curve and the measured values, selection of the theoretical curve which gives the lowest value of sum of squares, the value $x_{opt}$ of the parameter $x_0$ corresponding to the selected curve being the alignment measurement sought.

In a realization intended for measuring the alignment in a direction X, parallel to the surfaces of the structures, the sensitive elements have a form of parallel bars elongated in a direction Y of the plane of the surface, perpendicular to the direction X, and the heating element has a bar form parallel to the direction Y, larger, in the direction Y, than the sensitive elements.

The bars are preferably narrow in the direction X and elongated in the direction Y. They are close together, the spacing of the bars being related to the desired measurement precision. The heating element preferably has a greater length, in the direction X, than the sensitive elements.

One or more material layers organized so as to establish in the array an anisotropic thermal conductivity, higher in the direction perpendicular to the surfaces, lower in at least one of the directions X and Y parallel to the surface, can be interposed between the sensitive elements proper and the heating element. These layers can be placed on either of the two structures. Preferably, these layers are made of a material which is a good thermal conductor, subdivided into elements separated from one another in the direction X (this direction being that in which it is sought to measure the quality of alignment). The form of the portions of thermally conducting layers can be that of bars, like the temperature sensitive elements; the bars are then spaced apart in the direction X. The form of the thermally conducting elements can also be that of tags spaced apart in both the direction X and the direction Y.

The alignment calculation is preferably done by a processor external to the adjoining structures. The calculation means (in practice a programmed microprocessor) determines the position $x_{opt}$, referenced with respect to the array of sensitive elements, of the peak of a theoretical curve of temperature distribution corresponding as well as possible to the distribution of values representative of the temperature measured by the array of sensitive elements.

BRIEF DESCRIPTION OF DRAWINGS

Other characteristics and advantages of the invention will become apparent on reading the detailed description which follows and which is given with reference to the appended drawings in which:

FIG. 1 represents a basic diagram of the invention;

FIG. 2 represents in a more detailed manner an exemplary organization of the heating element and of the temperature sensitive elements;

FIG. 3 represents an example of a theoretical temperature profile engendered below the heating element;

FIG. 4 represents an example of temperature measurements made by the array of sensitive elements, and a theoretical profile of temperature distribution corresponding best to the measurements performed;

FIG. 5 represents an exemplary implementation of the invention with an interposition of thermally conducting parallel bars, between the heating element and the array of temperature sensitive elements.

DESCRIPTION OF PREFERRED EMBODIMENT

FIG. 1 summarizes the principle of the invention. Two structures (or objects) denoted S1 and S2 are placed face to face, with the aim of being glued together with a precise alignment of the structures with respect to one another in a direction X parallel to the opposing surfaces. The structures are for example semiconducting wafers or else a microchip and a wafer, but they could be other types of arbitrary structures each having a plane face and intended to be glued with their plane faces opposite one another. The structures are micro-machined, electronic or mixed (mechanical and electronic for example) structures. They are produced by photogravures, depositions, implantations, to produce elements (not represented) corresponding to the desired functionalities of the assembly of the two glued structures. One of the structures can comprise for example electrically conducting interconnections and contact pads intended to be placed in direct contact with corresponding contact pads formed on the other structure.

The structures S1 and S2 are seen in section in a plane perpendicular to their opposing surfaces; they are represented separated but they are intended to be glued, with or without gluing material.

The structures are furnished with means for determining the quality of alignment in the direction X parallel to the opposing surfaces. It will be understood that other means, separate from the first, can be designed to measure the alignment in a direction perpendicular to the direction X and parallel to the opposing surfaces.

The means for determining the quality of alignment comprise a heating element ECH formed on the surface of the first structure S1, more precisely on the face turned towards the other structure S2. They moreover comprise an array of temperature sensitive elements ES formed on the surface of the second structure, facing the first structure.

The heating element ECH has a known form, orientation and position with respect to the first structure S1. Likewise the temperature sensitive elements ES have known forms, positions and orientations with respect to the second structure S2. The positions of the heating element ECH and of the sensitive elements ES on the respective structure of which they form part are such that the heating element is opposite a well determined reference position in the array of sensitive elements when the structures are correctly aligned. Preferably, the reference position is a central position of the array of sensitive elements.

The determination of the alignment of the structures entails detecting the position of the heating element with respect to the reference position in the array of sensitive elements. A position deviation in one or the other sense is an indication of alignment error.

According to the invention, a temperature profile in the array of the second structure is searched for with the aid of the temperature sensitive elements and a piece of information regarding the most probable position of the heating element with respect to the array of sensitive elements is extracted from this profile. The position deviation of the heating element with respect to the reference position represents the alignment error. The alignment error is measured a posteriori once the structures are glued.

It was stated above that the heating element is produced on the surface of the first structure and the temperature sensitive elements are produced on the opposing surface of the second structure. It will be understood that these elements are produced according to microelectronics technologies which may require there to be depositions of additional layers between the elements and the external surface of the structures, typically passivation layers such as the layers 10 and 12, respectively on the first and the second structure, which protect the elements from external attack.

Represented in FIG. 2 is one possibility of geometric realization of the heating element and temperature sensitive elements. Only these elements are represented in FIG. 2. The heating element is a resistive bar elongated in a direction Y perpendicular to the direction X in which it is desired to measure the alignment error. The directions X and Y are parallel to the surface of the structures; the direction Z is perpendicular to these surfaces. The temperature sensitive elements ES are resistive bars, but whose resistance varies greatly with temperature. They are elongated in the same direction Y as the heating element ECH. The bars ES are narrow and close together. Preferably they are regularly spaced in the direction X. The length $L_{ch}$ of the heating bar ECH is preferably much greater than the length $L_{th}$ of the sensitive bars. The sensitive bars ES are distributed over a length $X_{th}$ in the direction X. The distribution spacing is $X_{th}/N$ if there are N elements. Assuming that the reference position of the bar ECH is in the middle of the array of sensitive elements ES, the detectable maximum alignment error is $X_{th}/2$ in either sense and the detection precision is better than $X_{th}/N$.

The heating element is linked, for the alignment measurement, to an energy source (not represented), based on current or voltage, which induces a thermal effect (Joule effect or the like). The temperature sensitive elements are linked to the multiple inputs of a measurement circuit (not represented) that is able to detect variations in the resistance of the elements, induced by temperature variations of the element. Typically, if the element is a resistor whose resistivity varies with temperature, the measurement circuit can comprise, for each element, a constant current source supplying this resistor and an amplifier for measuring the voltage across the terminals of the resistor. The various voltages arising from the temperature sensitive elements are gathered so as to be processed, preferably after analogue-digital conversion, by a calculation circuit which will deduce a possible alignment error. The calculation circuit can be external to the two structures and in this case the second structure must possess tags for external connection to transmit measurements to the calculation circuit.

FIG. 3 represents a numerical simulation curve, representing as ordinate a temperature induced by the heating element activated by an energy source, with as abscissa, in arbitrary units, the separation in one sense or in the other with respect to the heating element assumed placed at the abscissa $x_0$. The temperature can be graduated in arbitrary units, but, for ease of understanding, it has been assumed that the temperature varies from 25° (assumed to be the ambient temperature of the structures) to 39° substantially representing the temperature attained in the vicinity of the surface of the second structure, precisely opposite the heating element. The temperature decay follows a more or less exponential law as a function of the lateral distance with respect to the position $x_0$ of the heating element (at constant height below it).

It may be considered that the temperature follows this kind of law in a manner independent of the position in the direction Y, provided that it is taken towards the middle of the bars of FIG. 2 and that the bars are long enough (especially the bar constituting the heating element) to avoid edge effects. It is also assumed, in order to plot these curves, that the substrate constitutes a sort of heat sink in relation to the array of sensitive elements, that is to say the temperature of the structure does not rise globally on account of the activation of the heating element.

It is supposed that the temperature profile in the mid-plane of the array of sensitive elements (just where the edge effects do not make themselves felt) can be represented approximately by an equation such as:

$$T(x) = T_o + T_1 \cdot \exp\left(\frac{-|x - x_o|}{L_{ref}}\right) \quad \text{(equation 1)}$$

where x is the abscissa of a position on the X axis, $x_0$ is the abscissa of a reference position which is vertically in line with the centre of the heating element, $T(x)$ is the temperature at the surface of the second structure at the position x, $T_0$ and $T_1$ are constants (dimensionally equivalent to temperatures), and $L_{ref}$ is a reference length representing as it were a diffusion length for the heat in the horizontal direction.

This equation is a mathematical approximation of the physical phenomenon of diffusion of heat from the heating element. Generally, it may be said that in principle the curve will be symmetric with respect to a position $x_0$ which represents the centre of symmetry, on the X axis, of the heating element, typically half way along the width of the bar when it is a resistive bar. It will be understood that this symmetry may be imperfect because of the configurations of layers in proximity to the heating element, but it will be sought to construct these layers in the most symmetric possible manner, both on the first structure and on the second structure so as not to induce dissymmetries of temperature distribution which would falsify the calculations.

The two structures having been glued, the voltage which will make the heating element heat up is applied to the latter and the measurements provided by the temperature sensitive elements are used to determine a series of temperature values. It would also be possible to envisage doing this for structures on the point of being glued, on condition that the structures can be linked electrically to the exterior at this juncture so as to be powered up and to provide analogue or digital electronic measurement signals.

Represented in FIG. 4 are examples of measurement points which are digitized values of voltage or current, which themselves represent temperatures detected by the individual elements. The points are plotted with the position of the sensitive elements as abscissa. An abscissa position 0 is taken as a reference position above which the heating element ought to be if the structures were perfectly aligned. This position can be for example the abscissa $d_0$ of the centre of a central sensitive element of the array. The other sensitive elements are at positions $d_1, d_2, \ldots, d_6$ for the elements situated on one side and $d_{-1}, d_{-2}, \ldots$ on the other side. The ordinate quantities can be regarded as temperatures, in arbitrary units, by assuming that the resistive elements provide a voltage varying in proportion to the temperature (if they did not provide a proportional measurement it would be necessary to take account thereof in the calculations performed on these measurements).

It is noted that the measured values are distributed according to a curve which resembles that of FIG. 3 but which may be shifted more or less laterally with respect to the central position as a function of the degree of misalignment of the structures. In FIG. 4 may be seen on the one hand the measurement points and on the other hand an estimated temperature curve, in accordance with the mathematical function indicated above (equation 1) and passing in an optimal manner in proximity to these measurement points.

Various known calculation procedures make it possible to determine the position of the curve which passes best through the measurement points. A procedure based on non-linear regression is appropriate for this determination. Regression using least squares is the most suitable. It typically consists in establishing curves complying with equation 1 by varying the parameters $T_0$, $T_1$, $L_{ref}$ and $x_0$, in calculating for each curve, that is to say for each group of four parameters $T_0$, $T_1$, $L_{ref}$ and $x_0$, and for each of the known measurement abscissae ($d_{-6}$ to $d_{+6}$ in FIG. 4) the square of the difference between the measured value and the value given by the curve for this abscissa, in adding together the squares for all the measurement points for a given curve, and in searching for the combination of parameters $T_0$, $T_1$, $L_{ref}$ and $x_0$, which minimizes the sum of the squares. The procedure can be refined by using, rather than the difference between the measured value and the calculated value, this difference divided by the estimated uncertainty in the measured value, when the estimated uncertainty is not the same for all the measurement points. The sum of the squares of the differences is then a weighted sum and the weighting is in this case done through the inverse of the squares of the uncertainties for each measurement.

The value of $x_0$ which provides the curve passing best through the measurement points is denoted $x_{opt}$ in FIG. 4. The value $x_{opt}$ then represents the deviation in alignment between the two structures. The precision of the measurement depends of course on the (relative) precision of measurement of the temperatures and the distribution spacing of the sensitive elements. The precision may be better than the distribution spacing.

The details of the technologies that can be used to produce the heating element and the temperature sensitive elements will not be entered into. These technologies are very numerous and production will be adapted to the technology of each of the structures to be aligned. The technology used to produce the temperature sensitive elements may be different from the technology used to produce the heating element, notably in the case where the two structures to be glued are not made with the same technology.

By way of example: the heating element may be a resistive element (for example in the form of a metallic layer with a sufficiently resistive metal or in the form of a semiconducting layer), but it may also be the channel of a transistor. The resistive element may be made in the form of a layer which is deposited (doped polycrystalline silicon) or integrated into the silicon of the substrate by virtue of a local implantation with a dopant making it possible to define the geometry and the conductivity of the resistor. Given that the structure which carries the heating element carries other electronic devices unrelated to the issue of alignment, it will often be produced with several levels of insulating, conducting or semiconducting depositions overlaid above the starting semiconductor substrate and there will be advantage in producing the heating element in one of the higher levels of the structure so that it is as close as possible to the surface in contact with the second structure. In an optimal manner, a simple planarized passivation layer covers the heating element.

The heating element preferably has a very elongate geometry, which is as narrow as possible in the alignment measurement direction X, so as to confine the heat source in a very narrow zone in this direction X.

The temperature sensitive elements can be resistive elements whose resistivity varies with temperature or diodes or transistors. If variable resistors are used, the resistive material chosen must be a material whose resistivity depends on temperature. Semiconductors comply with this criterion. A diode exhibits the advantage of being very sensitive to temperature when it is reverse biased. The current in a slightly forward biased transistor is also temperature sensitive.

Just as for the heating element, it is preferable that the sensitive elements be as close as possible to the external surface of the structure and therefore the surface of the other structure which carries the heating element. From this point of view it is preferable to make sensitive elements by depositing a resistive layer.

The temperature sensitive elements must be as narrow and close together as possible in the direction X so as to obtain a precise alignment measurement. They have a form elongated in the perpendicular direction Y to reduce the edge effects of the temperature diffusion. The elongation is in a direction parallel to that of the heating element. The heating element is, however, preferably longer than the sensitive elements (in FIG. 2: $L_{ch}$ is preferably greater than $5.L_{th}$); and it is preferably longer than the extent, in the direction X, of the array of sensitive elements (in FIG. 2: $L_{ch}$ is preferably greater than $Z_{th}$, for example twice as great).

The number of sensitive elements depends on the desired precision; it is at least 5 and may be much higher (several tens to several hundreds, though taking into account the fact that increasing the number increases the area consumed and the calculational power required in order to make the comparisons of curves explained above).

It is preferable but not compulsory that the sensitive elements be distributed with a constant spacing. In any event, their relative position with respect to the whole of the structure on which they are produced must be known. It is possible to envisage however that the distribution spacing be narrower around the desired ideal position, in principle at the centre of the array, and wider at the ends of the array.

The extent of the array will be chosen as a function of the maximum misalignment that it is desired to be able to measure. It is for example twice as great as the maximum range that it is desired to measure.

Given that the principle of this measurement system relies on detecting a temperature profile engendered locally by a heating element, it is desirable that a lateral temperature profile with a marked peak be established over the array of sensitive elements. It is then preferred that the sensitive elements be embedded in an environment in which thermal conductivity is anisotropic, lower in the direction X than in the direction Z.

It is possible to use for this purpose an organized layer of material with high thermal conductivity inserted between the heating element and the array of sensitive elements (in practice produced on the second structure above the sensitive elements). The material, a good thermal conductor (for example a metal), is distributed preferably regularly in the direction X. In this way the heat dissipation is more easily concentrated towards the sensitive elements.

FIG. 5 represents such a structure with thermally conducting bars B above the temperature sensitive resistive bars ES. In the example represented, the thermally conducting bars are more numerous than the resistive bars. Just where they are overlaid on the conducting bars, they can be in direct contact with these bars, though on condition that they are moreover electrically insulated from any other conductor so as not to prevent the resistive elements from playing their measurement role.

The conducting material can typically be a metallic material that is used in microelectronics technologies to form electrically conducting vias between two interconnection levels. The metal can be copper for example.

Rather than thermally conducting bars provision may be made for distributed conducting tags, but then, while not compulsory, it is preferable for these tags to be aligned parallel to the resistive bars and above the latter. They can also be disposed quincuncially.

If the structure which carries the temperature sensitive elements is produced in a technology with several interconnection levels separated by vias, provision may also be made for the thermally conducting tags or bars to be disposed on several overlaid levels, still with the aim of increasing the vertical thermal conductivity with respect to the conductivity in the direction X.

The electronic device which utilizes the measurement of the temperature by each sensitive element is in principle external to the overlaid structures. At least one external connection tag on the first structure then serves to apply a current to the heating device, and at least one external tag on the second structure serves to gather a temperature-representative electrical signal, arising from the various sensitive elements of the second structure. To avoid having as many tags as sensitive elements, or indeed twice as many tags as sensitive elements, provision is preferably made for the second structure to comprise embedded electronic circuits making it possible to apply simultaneously or successively a current or a voltage to each element and to gather a piece of information regarding the temperature of each of them. A scan sequencer allows for example the measurement to be performed successively on the various elements so as to transmit the successive measurements on a single output tag. Given that the misalignment measurement requires calculations, an analogue-digital conversion can be done in the first structure so as to output in series on one or more tags for external connection a succession of digital values representing the various measured temperatures. The utilization by calculation of these digital values, to find the misalignment value $x_{opt}$, is preferably done by a programmed microprocessor external to the two structures.

The method according to the invention exhibits the advantage of being non-destructive (when measuring the alignment of already glued structures); the method is applicable to the gluing of microchips onto a wafer or of one wafer onto another wafer; it does not impose the transparency constraints demanded by optical procedures; the substrate of each structure can therefore be made of an arbitrary material, as can the gluing material if there is any. It is possible to envisage its implementation for more than two overlaid structures and to check the alignment independently of each structure with respect to the next one in the overlay.

The positioning precision can be less than a micrometer. The alignment measurement can serve not only to check the items produced, but also to calibrate the gluing equipment by measuring the misalignment skew that they produce and by compensating for this skew systematically before undertaking gluing.

A simple way of making a heating element satisfying the requirements is to produce it in the form of a transistor whose channel length is oriented in the direction X and is fairly short, for example that of the technology implemented in the 1st structure, but whose channel width in the direction Y is much larger and markedly greater than the conceivable maximum misalignment. The advantage of such an embodiment is that it is well known and well mastered by the person skilled in the art, easy to integrate into a conventional fabrication process intended for a circuit integrating CMOS. It is moreover possible to generate fairly high lineal power densities (per unit width of the transistor). The problem of the intake of current at the source and at the drain can be readily solved with copper interconnections which are mainly oriented in the direction Y.

A preferred way of producing the sensitive elements is to make them in the highest possible interconnection levels, in the form of a doped polysilicon resistor. The person skilled in the art knows how to produce these resistors by conventional microelectronics methods (depositions, implantation and diffusion of impurities, photolithography, etc.). It is preferable that they be as narrow as possible in the direction X. The dimension in the direction Y will result from the following compromise: it must be at one and the same time markedly smaller than the dimension Y of the transistor so as to remain in the zone where the temperature field is mainly two-dimensional and be at one and the same time large enough in the direction Y to have a high enough resistance and therefore easily measurable since it is markedly larger than the resistance of the current intake lines. One of the advantages of this embodiment is that polysilicon resistors have a fairly strong variation in resistance as a function of temperature. Another advantage is that the person skilled in the art knows how to easily adjust the doping to obtain the value of the resistance that he desires: this value should preferably be fairly large relative to the resistance of the current intakes. Yet another advantage is that it is possible to make these polysilicon resistors in the higher levels of interconnections, close to the gluing interface.

The invention claimed is:

1. A device for measuring the relative alignment or misalignment of adjoining structures, comprising:
   a. two plane structures, adjoining face to face and fastened together;
      i. wherein the first structure comprises, on its face opposite the second structure, a heating element whose form, orientation and position are known; and
      ii. the second structure comprises, on its face opposite the first structure, an array of temperature sensitive elements whose form, orientation and position with respect to the second structure are also known;
   b. the device also comprising an electrical power supply means for the heating element of the first structure;
   c. a means for establishing electrical measurements representing the distribution of temperatures in the array; and
   d. means for deducing from this distribution a measurement of relative alignment or misalignment of the adjoining structures.

2. A device according to claim 1, wherein the sensitive elements have a form of parallel bars elongated in a direction Y of the plane of the surface, perpendicular to a direction X in which it is desired to measure the alignment, and the heating element has a bar form parallel to the direction Y.

3. A device according to claim 1, comprising, interposed between the sensitive elements and the heating element, at least one layer organized so as to establish in the array an anisotropic thermal conductivity, higher in the direction perpendicular to the opposite faces, lower in at least one direction in which it is desired to measure the alignment.

4. A device according to claim 1, comprising, preferably external to the adjoining structures, a calculation means able to perform the determination of the position x.sub.opt, referenced with respect to the array of sensitive elements, of the peak of a theoretical curve of temperature distribution corresponding best to the distribution of values representative of the temperature measured by the array of sensitive elements.

5. A device according to claim 2, wherein the sensitive elements are constituted in a material whose resistivity varies with temperature.

6. A device according to claim 2, comprising, interposed between the sensitive elements and the heating element, at least one layer organized so as to establish in the array an anisotropic thermal conductivity, higher in the direction perpendicular to the opposite faces, lower in at least one direction in which it is desired to measure the alignment.

7. A device according to claim 2, comprising, preferably external to the adjoining structures, a calculation means able to perform the determination of the position x.sub.opt, referenced with respect to the array of sensitive elements, of the peak of a theoretical curve of temperature distribution corresponding best to the distribution of values representative of the temperature measured by the array of sensitive elements.

8. A device according to claim 2, comprising, preferably external to the adjoining structures, a calculation means able to perform the determination of the position x.sub.opt, referenced with respect to the array of sensitive elements, of the peak of a theoretical curve of temperature distribution corresponding best to the distribution of values representative of the temperature measured by the array of sensitive elements.

9. A device according to claim 3, wherein the layer establishing an anisotropic thermal conductivity comprises elements in the form of parallel bars of a material with high thermal conductivity, spaced apart.

10. A device according to claim 3, wherein the layer establishing an anisotropic thermal conductivity comprises elements in the form of tags of a material with high thermal conductivity, spaced apart.

11. A device according to claim 4, comprising, preferably external to the adjoining structures, a calculation means able to perform the determination of the position x.sub.opt, referenced with respect to the array of sensitive elements, of the peak of a theoretical curve of temperature distribution corresponding best to the distribution of values representative of the temperature measured by the array of sensitive elements.

12. A device according to claim 5, comprising, interposed between the sensitive elements and the heating element, at least one layer organized so as to establish in the array an anisotropic thermal conductivity, higher in the direction perpendicular to the opposite faces, lower in at least one direction in which it is desired to measure the alignment.

13. A device according to claim 5, comprising, preferably external to the adjoining structures, a calculation means able to perform the determination of the position x.sub.opt, referenced with respect to the array of sensitive elements, of the peak of a theoretical curve of temperature distribution corresponding best to the distribution of values representative of the temperature measured by the array of sensitive elements.

* * * * *